(12) United States Patent
Zhang et al.

(10) Patent No.: US 11,295,651 B2
(45) Date of Patent: Apr. 5, 2022

(54) COUNTER, PIXEL CIRCUIT, DISPLAY PANEL AND DISPLAY DEVICE

(71) Applicant: BOE TECHNOLOGY GROUP CO., LTD., Beijing (CN)

(72) Inventors: Junrui Zhang, Beijing (CN); Xuehui Zhu, Beijing (CN); Lijia Zhou, Beijing (CN); Zhidong Wang, Beijing (CN); Quanguo Zhou, Beijing (CN); Yungchiang Lee, Beijing (CN); Meng Guo, Beijing (CN); Jiuyang Cheng, Beijing (CN); Zongze He, Beijing (CN); Qin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/939,188

(22) Filed: Jul. 27, 2020

(65) Prior Publication Data

US 2021/0097914 A1    Apr. 1, 2021

(30) Foreign Application Priority Data

Sep. 26, 2019   (CN) .......................... 201910916483.2

(51) Int. Cl.
| | |
|---|---|
| H03K 21/00 | (2006.01) |
| G09G 3/20 | (2006.01) |
| H03K 19/20 | (2006.01) |
| H03K 21/02 | (2006.01) |

(Continued)

(52) U.S. Cl.
CPC ........... *G09G 3/20* (2013.01); *H03K 19/0016* (2013.01); *H03K 19/20* (2013.01); *H03K 21/026* (2013.01); *H03K 21/10* (2013.01); *G09G 2310/08* (2013.01)

(58) Field of Classification Search
None
See application file for complete search history.

(56) References Cited

U.S. PATENT DOCUMENTS

| | | | |
|---|---|---|---|
| 2004/0150610 A1* | 8/2004 | Zebedee | ................. G11C 19/28 345/100 |
| 2007/0146290 A1* | 6/2007 | Hirama | ................. G09G 3/3677 345/100 |

(Continued)

*Primary Examiner* — Tuan T Lam
(74) *Attorney, Agent, or Firm* — Brooks Kushman P.C.

(57) ABSTRACT

Counter, pixel circuit, display panel, display device are provided. The counter includes: start-up circuit generating and outputting start-up signal by clock signal; M first and M second combinational logic circuits, alternate and cascaded, where M is integer no less than 1. Input terminal of first combinational logic circuit is coupled to output terminal of start-up circuit or second combinational logic circuit of previous stage, input terminal of second combinational logic circuit is coupled to output terminal of first combinational logic circuit of previous stage. Clock signal terminals of first, second combinational logic circuits are for inputting clock signal. First combinational logic circuit is for outputting clock signal in first time period and continuously outputting low level signal in second time period. Second combinational logic circuit is for outputting inverted signal of clock signal in third time period and continuously outputting low level signal in fourth time period.

20 Claims, 5 Drawing Sheets

(51) Int. Cl.
*H03K 21/10* (2006.01)
*H03K 19/00* (2006.01)

(56) References Cited

U.S. PATENT DOCUMENTS

| | | | | |
|---|---|---|---|---|
| 2009/0257290 A1* | 10/2009 | Kim | .................... | G11C 19/28 365/189.12 |
| 2013/0257703 A1* | 10/2013 | Huang | .................... | G11C 19/00 345/100 |
| 2014/0003571 A1* | 1/2014 | Yamamura | ........... | G09G 3/3677 377/74 |
| 2015/0228354 A1* | 8/2015 | Qing | .................... | G09G 3/3674 345/100 |
| 2016/0133336 A1* | 5/2016 | Lim | .................... | G11C 7/1066 365/230.03 |

\* cited by examiner

COUNTER, PIXEL CIRCUIT, DISPLAY PANEL AND DISPLAY DEVICE

CROSS-REFERENCE TO RELATED APPLICATION

This application claims priority to Chinese Patent Application No. 201910916483.2 filed on Sep. 26, 2019, which is incorporated herein by reference in its entirety.

TECHNICAL FIELD

The present disclosure relates to the field of display technology, and in particular to a counter, a pixel circuit, a display panel, and a display device.

BACKGROUND

Binary counters are usually adopted to count, so as to obtain a square wave pulse sampling signal via a combinational logic circuit at each count.

SUMMARY

In a first aspect of the present disclosure, a counter is provided, including: a start-up circuit, configured to generate a start-up signal according to an inputted clock signal and output the start-up signal; and M first combinational logic circuits and M second combinational logic circuits, where the M first combinational logic circuits and the M second combinational logic circuits are alternate and cascaded, and M is an integer greater than or equal to 1; where an input terminal of the first combinational logic circuit is coupled to an output terminal of the start-up circuit or an output terminal of the second combinational logic circuit of a previous stage, an input terminal of the second combinational logic circuit is coupled to an output terminal of the first combinational logic circuit of a previous stage, and each of a clock signal terminal of the first combinational logic circuit and a clock signal terminal of the second combinational logic circuit is configured to input the clock signal; and where the first combinational logic circuit is configured to output the clock signal in a first time period and continuously output a low level signal in a second time period, and the second combinational logic circuit is configured to output an inverted signal of the clock signal in a third time period and continuously output a low level signal in a fourth time period.

In addition, the counter according to the above embodiments of the present disclosure may also have the following additional technical features.

According to some embodiments of the present disclosure, the start-up circuit is configured to: generate the start-up signal of a current moment according to the clock signal and a start-up signal of a previous moment, where the start-up signal of the previous moment is fed back by the start-up circuit.

According to some embodiments of the present disclosure, the start-up circuit includes: a first NOR gate, where a first input terminal of the first NOR gate is configured to input the clock signal, and an output terminal of the first NOR gate is configured to output the start-up signal; and a first NOT gate, where an input terminal of the first NOT gate is coupled to the output terminal of the first NOR gate, and an output terminal of the first NOT gate is coupled to a second input terminal of the first NOR gate.

According to some embodiments of the present disclosure, the first combinational logic circuit is configured to: output the clock signal in the first time period and continuously output the low level signal in the second time period, according to the start-up signal or a signal of the output terminal of the second combinational logic circuit of the previous stage and according to a signal fed back by the first combinational logic circuit at a previous moment.

According to some embodiments of the present disclosure, the first combinational logic circuit includes: a second NOR gate, where a first input terminal of the second NOR gate is coupled to the output terminal of the start-up circuit or the output terminal of the combinational logic circuit of the previous stage; a first transistor, where a control electrode of the first transistor is coupled to an output terminal of the second NOR gate, a first electrode of the first transistor is coupled to a second input terminal of the second NOR gate, and a second electrode of the first transistor is grounded; a first transmission gate, where an input terminal of the first transmission gate is configured to input the clock signal, a first control terminal of the transmission gate is coupled to the output terminal of the second NOR gate, an output terminal of the first transmission gate is coupled to the output terminal of the first combinational logic circuit, and the output terminal of the first transmission gate is configured to output the clock signal when the first transmission gate is turned on and continuously output a low level signal when the first transmission gate is turned off; and a second NOT gate, where an input terminal of the second NOT gate is coupled to the output terminal of the second NOR gate, and an output terminal of the second NOT gate is coupled to a second control terminal of the first transmission gate.

According to some embodiments of the present disclosure, the second combinational logic circuit is configured to: output the inverted signal of the clock signal in the third time period and continuously output the low level signal in the fourth time period, according to a signal of the output terminal of the first combinational logic circuit of the previous stage and a signal fed back by the second combinational logic circuit at a previous moment.

According to some embodiments of the present disclosure, the second combinational logic circuit includes: a third NOR gate, where a first input terminal of the third NOR gate is coupled to the output terminal of the combinational logic circuit of the previous stage, and a second input terminal of the third NOR gate is coupled to the output terminal of the second combinational logic circuit; a third NOT gate, where an input terminal of the third NOT gate is coupled to an output terminal of the third NOR gate; a second transistor, where a control electrode of the second transistor is coupled to the output terminal of the third NOT gate, and a first electrode of the second transistor is configured to input a direct current power signal; a fourth NOT gate, where an input terminal of the fourth NOT gate is coupled to a second electrode of the second transistor, and an output terminal of the fourth NOT gate is coupled to the output terminal of the second combinational logic circuit; and a second transmission gate, where an input terminal of the second transmission gate is configured to input the clock signal, a first control terminal of the second transmission gate is coupled to the output terminal of the third NOR gate, a second control terminal of the second transmission gate is coupled to an output terminal of the third NOT gate, an output terminal of the second transmission gate is coupled to the input terminal of the fourth NOT gate, and the output terminal of the second transmission gate is configured to output the clock signal when the second transmission gate is turned on and continuously output a high level signal when the second transmission gate is turned off.

Further, in a second aspect of the present disclosure, a pixel circuit is provided, including the counter described above.

Further, in a third aspect of the present disclosure, a display panel is provided, including the pixel circuit described above.

Further, in a fourth aspect of the present disclosure, a display device is provided, including a housing and the display panel described above.

Some of the additional aspects and advantages of the present disclosure will be provided in the following descriptions, and some will become apparent from the following descriptions or be understood through the practice of the present disclosure.

DETAILED DESCRIPTION

The embodiments of the present disclosure are described in detail hereinafter. Examples of the embodiments are shown in the accompanying drawings, where the same or similar reference numbers represent the same or similar elements or elements with the same or similar functions. The embodiments described with reference to the accompanying drawings hereinafter are exemplary and intended to explain the present disclosure, and should not be construed as limiting the present disclosure.

A counter, a pixel circuit, a display panel, and a display device according to embodiments of the present disclosure are described hereinafter with reference to the drawings.

Figure 1:
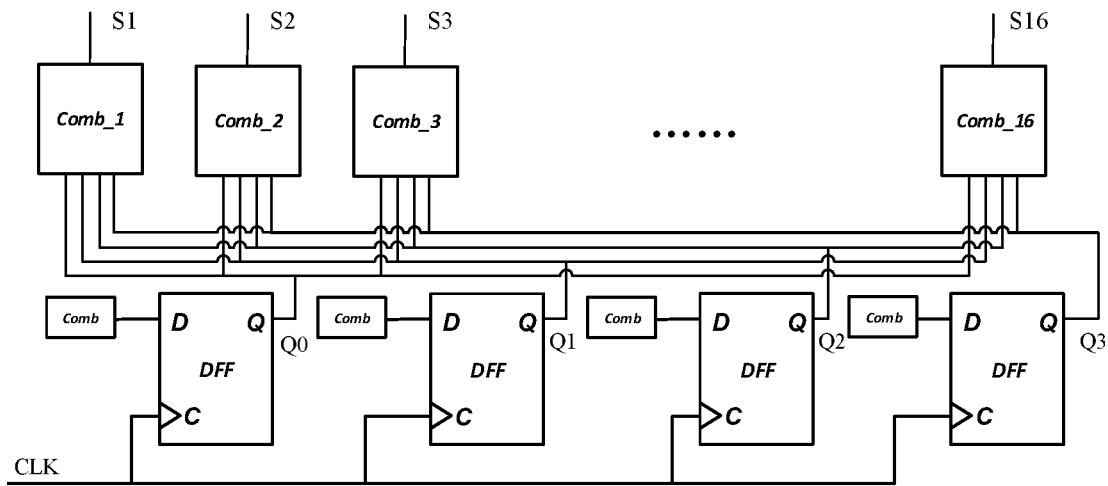
FIG. 1 is a design principle diagram of a pulse sampling signal generated by a binary counter in the related technologies.

FIG. 1 is a design principle diagram of a pulse sampling signal generated by a binary counter in the related technologies.

As shown in FIG. 1, a modulo-16 counter is taken as an example. Four D flip-flops are coupled in series and controlled uniformly by a clock signal. An output of each D flip-flop may generate a required control signal through a combinational logic circuit.

Figure 2:
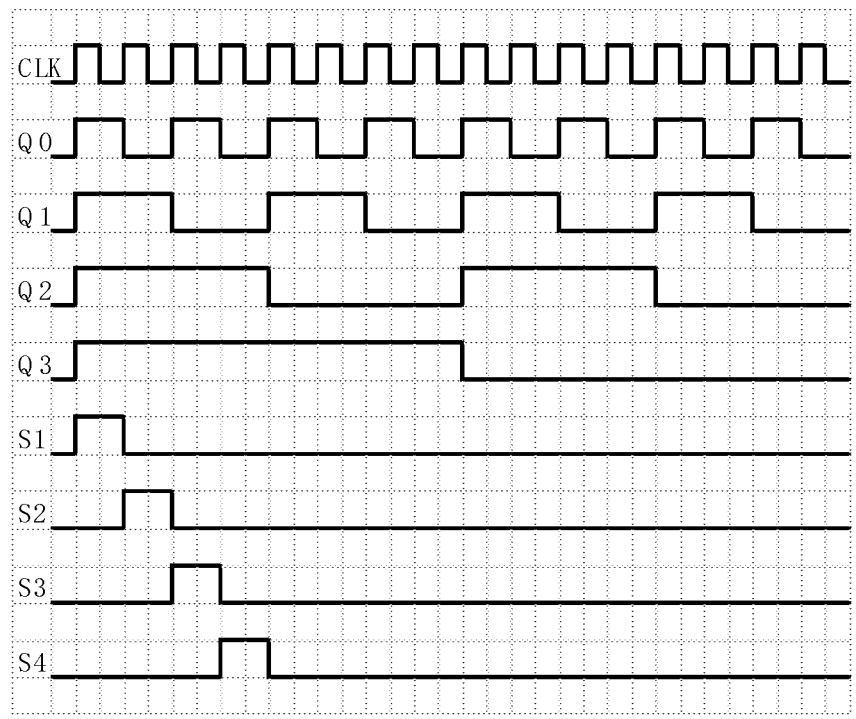
FIG. 2 is a timing diagram of a pulse sampling signal generated by binary counting in the related technologies.

Further, as shown in FIG. 2, in an ideal situation, Q3, Q2, Q1 and Q0 may form a binary number to represent the (16-N)-th rising edge, for example, the binary number 0000 may represent the sixteenth rising edge. Q3, Q2, Q1 and Q0 may be synthesized into pulse signals through combinational logics, to control other logics.

It can be seen that, if a pulse signal for sampling needs to be generated for each step (for example, as shown in FIGS. 2, S1, S2, S3 and S4 may be generated by the combinational logic circuits of Comb_1, Comb_2, Comb_3 and Comb_4 respectively), and if the modulo-16 counter generates 16 pulse sampling signals, then 16 combinational logic circuits are required. As a result, a large number of combinational logic gates need to be added to the circuit structure, occupying a relatively large layout area and resulting in relatively high power consumption.

It can be seen that in the related technologies, when a binary counter is used for counting and in a case that multiple square wave pulse sampling signals need to be generated, multiple combinational logic circuits may be required at the same time to achieve this. However, the multiple combinational logic circuits occupy a relatively large layout area and have relatively high power consumption.

To address the problems in the related technologies described above, embodiments of the present disclosure provide a counter.

According to some embodiments of the present disclosure, the counter may include: a start-up circuit, configured to generate a start-up signal according to an inputted clock signal and output the start-up signal; and M first combinational logic circuits and M second combinational logic circuits, where the M first combinational logic circuits and the M second combinational logic circuits are alternate and cascaded, and M is an integer greater than or equal to 1. An input terminal of the first combinational logic circuit is coupled to an output terminal of the start-up circuit or an output terminal of the second combinational logic circuit of a previous stage, and an input terminal of the second combinational logic circuit is coupled to an output terminal of the first combinational logic circuit of a previous stage. Each of a clock signal terminal of the first combinational logic circuit and a clock signal terminal of the second combinational logic circuit is configured to input the clock signal. The first combinational logic circuit is configured to output the clock signal in a first time period and continuously output a low level signal in a second time period. The second combinational logic circuit is configured to output an inverted signal of the clock signal in a third time period and continuously output a low level signal in a fourth time period.

In some embodiments of the present disclosure, M may be an integer greater than or equal to 2.

Figure 3:
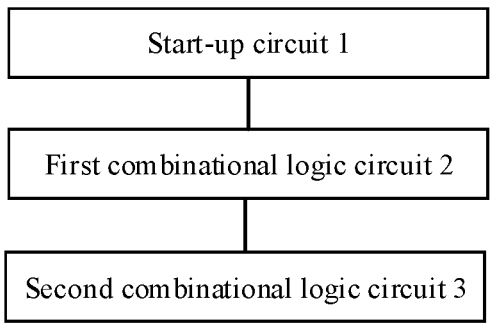
FIG. 3 is a block diagram of a counter according to some embodiments of the present disclosure.

FIG. 3 is a block diagram of a counter according to some embodiments of the present disclosure.

As shown in FIG. 3, the counter 100 includes: a start-up circuit 1, a first combinational logic circuit 2 and a second combinational logic circuit 3.

Figure 4:
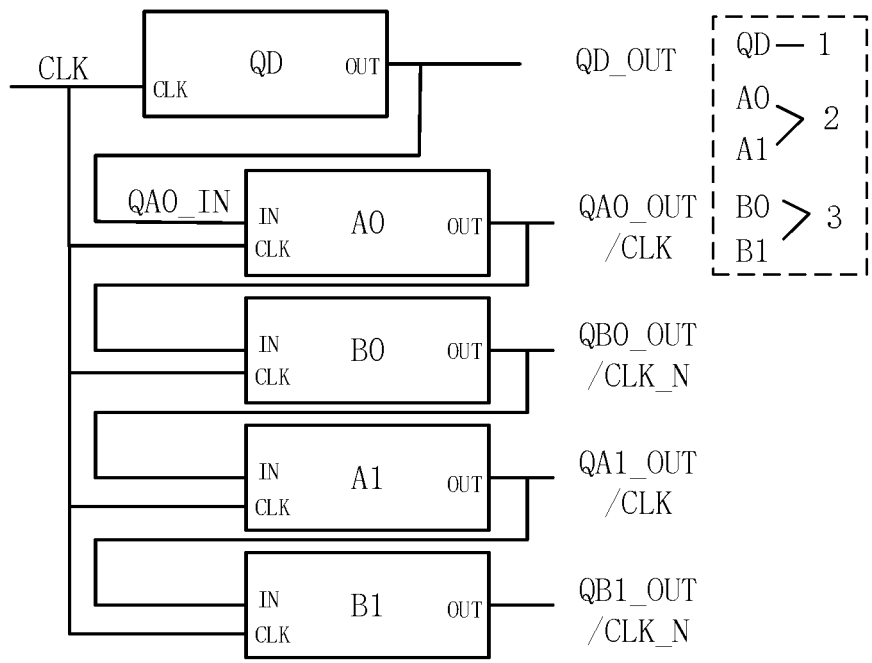
FIG. 4 is a design principle diagram of counting of a counter according to some specific embodiments of the present disclosure.

The start-up circuit 1 is configured to generate a start-up signal according to an inputted clock signal, and output the start-up signal. As shown in FIG. 4, the first combinational logic circuit 2 (corresponding to A0 and A1 in FIG. 4) and the second combinational logic circuit 3 (corresponding to B0 and B1 in FIG. 4) are alternately cascaded. The input terminal of the first combinational logic circuit 2 is coupled to the output terminal of the start-up circuit 1 or the output terminal of the second combinational logic circuit 3 of the previous stage. The input terminal of the second combinational logic circuit 3 is coupled to the output terminal of the first combinational logic circuit 2 of the previous stage. A clock signal terminal of the first combinational logic circuit 2 and a clock signal terminal of the second combinational logic circuit 3 are each configured to input the clock signal. The first combinational logic circuit 2 is configured to output the clock signal or continuously output a low level signal; the second combinational logic circuit 3 is configured to output an inverted signal of the clock signal or continuously output a low level signal. For example, the first combinational logic circuit 2 is configured to output the clock signal in a first time period and continuously output a low level signal in a second time period; and the second combinational logic circuit 3 is configured to output an inverted signal of the clock signal in a third time period and continuously output a low level signal in a fourth time period.

That is, in the embodiments of the present disclosure, the counter 100 may generate and output the start-up signal according to the inputted clock signal via the start-up circuit 1, then, output the clock signal inputted to the clock signal terminal of the first combinational logic circuit 2 or continuously output the low level signal via the first combinational logic circuit 2, and output the inverted signal of the clock signal inputted to the clock signal terminal of the second combinational logic circuit 3 or continuously output the low level signal via the second combinational logic circuit 3, so as to divide the clock signal to generate multiple sampling pulse signals.

Specifically, the input terminal of the first combinational logic circuit 2 may be coupled to the output terminal of the start-up circuit 1 or the output terminal of the second combinational logic circuit 3 of the previous stage, to receive a signal from the output terminal of the start-up circuit 1 or to receive a signal from the output terminal of the second combinational logic circuit 3 of a previous stage, and output the clock signal inputted to the clock signal terminal of the first combinational logic circuit 2 or continuously output the low level signal via the first combinational logic circuit 2. The input terminal of the second combinational logic circuit 3 may be coupled to the output terminal of the first combinational logic circuit 2 of the previous stage, to receive the signal from the output terminal of the first combinational logic circuit 2 of the previous stage, and output the inverted signal of the clock signal inputted to the clock signal terminal of the second combinational logic circuit 3 or continuously output the low level signal via the combinational logic circuit 3. In this way, the clock signal is divided to generate multiple sampling pulse signals.

According to some embodiments of the present disclosure, the start-up circuit 1 is further configured to: generate the start-up signal of the current moment according to the clock signal and the output signal of the previous moment fed back by itself.

That is to say, the start-up circuit 1 may generate the start-up signal of the current moment according to the clock signal and the output signal of the previous moment fed back by itself, to output the start-up signal of the current moment and output it to the input terminal of the first combinational logic 2 via the output terminal of the start-up circuit 1.

Figure 5:
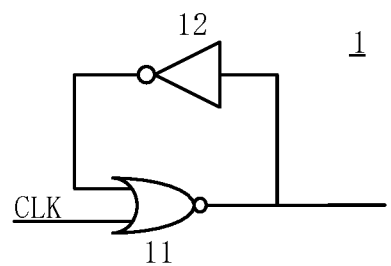
FIG. 5 is a schematic structural diagram of a start-up circuit according to some embodiments of the present disclosure.

According to some embodiments of the present disclosure, as shown in FIG. 5, the start-up circuit 1 includes: a first NOR gate 11 and a first NOT gate 12.

The first input terminal of the first NOR gate 11 is configured to input the clock signal, and the output terminal of the first NOR gate 11 is configured to output the start-up signal; and the input terminal of the first NOT gate 12 is coupled to the output terminal of the first NOR gate 11, and the output terminal of the first NOT gate 12 is coupled to the second input terminal of the first NOR gate 11.

For example, in embodiments of the present disclosure, if the signal at the first input terminal of the first NOR gate 11 is a low level signal, and the signal at the second input terminal of the first NOR gate 11 is a low level signal (no input), then the output terminal of the first NOR gate 11 outputs the start-up signal (high level signal), and the output terminal of the first NOT gate 12 outputs a low level signal.

It should be noted that if the signal at the second input terminal of the first NOR gate 11 is a high level signal, the output terminal of the first NOR gate 11 stops outputting the start-up signal (no output), and the output terminal of the first NOT gate 12 continuously outputs a high level signal. In other words, when the signal at the second input terminal of the first NOR gate 11 is a high level signal, regardless of whether the clock signal at the first input terminal of the first NOR gate 11 is a high level signal or a low level signal, the output terminal of the first NOR gate 11 outputs a low level signal (no output) and the output terminal of the first NOT gate 12 outputs a high level signal.

According to some embodiments of the present disclosure, the first combinational logic circuit 2 is specifically configured to: output the clock signal or continuously output the low level signal, according to the start-up signal or a signal of the output terminal of the second combinational logic circuit 3 of the previous stage and according to a signal fed back by the first combinational logic circuit 2 at a previous moment. For example, the first combinational logic circuit 2 is specifically configured to: output the clock signal in the first time period and continuously output the low level signal in the second time period, according to the start-up signal or a signal of the output terminal of the second combinational logic circuit 3 of the previous stage and according to a signal fed back by the first combinational logic circuit 2 at a previous moment.

In other words, the first combinational logic circuit 2 may output the clock signal or continuously output the low level, according to the start-up signal or the signal at the output terminal of the second combinational logic circuit 3 of the previous stage, and according to the output signal of the previous moment fed back by itself. In this way, the clock signal is divided to generate multiple sampling pulse signals.

Figure 6:
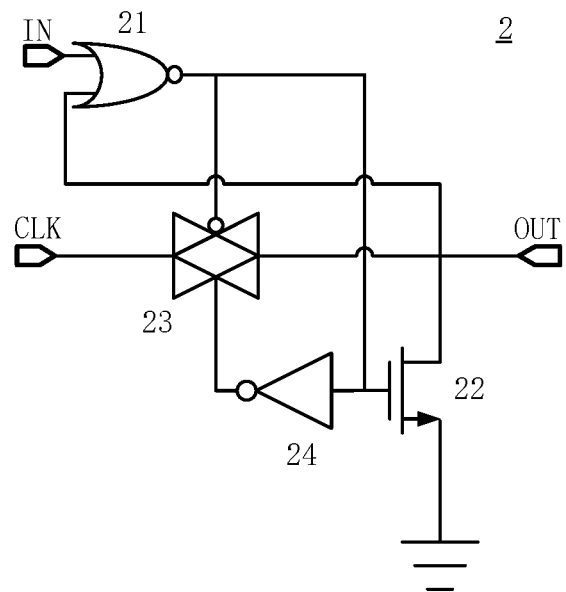
FIG. 6 is a schematic structural diagram of a first combinational logic circuit according to some embodiments of the present disclosure.

According to some embodiments of the present disclosure, as shown in FIG. 6, the first combinational logic circuit 2 includes: a second NOR gate 21, a first transistor 22, a first transmission gate 23 and a second NOT gate 24.

The first input terminal of the second NOR gate 21 is coupled to the output terminal of the start-up circuit 1 or the output terminal of the combinational logic circuit 2 of the previous stage; the control electrode of the first transistor 22 is coupled to the output terminal of the second NOR gate 21, the first electrode of the first transistor 22 is coupled to the second input terminal of the second NOR gate 21, and the second electrode of the first transistor 22 is grounded. The input terminal of the first transmission gate 23 is configured to input the clock signal, the first control terminal of the first transmission gate 23 is coupled to the output terminal of the second NOR gate 21, and the output terminal of the first transmission gate 23 is coupled to the output terminal of the first combinational logic circuit 2. The output terminal of the first transmission gate 23 is configured to output the clock signal when the first transmission gate 23 is turned on, and continuously output a low level signal when the first transmission gate 23 is turned off. The input terminal of the second NOT gate 24 is coupled to the output terminal of the second NOR gate 21, and the output terminal of the second NOT gate 24 is coupled to the second control terminal of the first transmission gate 23.

For example, in embodiments of the present disclosure, if the signal at the output terminal of the start-up circuit 1 or the signal at the output terminal of the second combinational logic circuit 3 of the previous stage is a high level signal, that is, the signal at the first input terminal of the second NOR gate 21 being a high level signal, then the signal at the output terminal of the second NOR gate 21 is a low level signal, the control electrode of the first transistor 22 is in a low level, the signal at the first control terminal of the first transmission gate 23 is a low level signal, the signal at the output terminal of the second NOT gate 24 is a high level signal, and the signal at the second control terminal of the first transmission gate 23 is a high level signal. In this case, the first transmission gate 23 is turned on, the first transistor 22 is turned off, and the output terminal of the first transmission gate 23 outputs the clock signal.

If the signal at the output terminal of the start-up circuit 1 or the signal at the output terminal of the second combinational logic circuit 3 of the previous stage is a low level signal, and the signal fed back by the first combinational logic circuit 2 at the previous moment is a low level signal, that is, the signals at the first input terminal and the second input terminal of the second NOR gate 21 both being low level signals, then the signal at the output terminal of the second NOR gate 21 is a high level signal, the control electrode of the first transistor 22 is in a high level, and the signal at the first control terminal of the transmission gate 23 is a high level signal. In this case, the first transmission gate 23 is turned off, the first transistor 22 is turned on, and the output terminal of the first transmission gate 23 continuously outputs a low level signal.

According to some embodiments of the present disclosure, the second combinational logic circuit 3 is specifically configured to: output the inverted signal of the clock signal or continuously output the low level signal, according to a signal of the output terminal of the first combinational logic circuit 2 of the previous stage and a signal fed back by the second combinational logic circuit 3 at a previous moment. For example, the second combinational logic circuit 3 is specifically configured to: output the inverted signal of the clock signal in the third time period and continuously output the low level signal in the fourth time period, according to a signal of the output terminal of the first combinational logic circuit 2 of the previous stage and a signal fed back by the second combinational logic circuit 3 at a previous moment.

In other words, the second combinational logic circuit 3 may output the inverted signal of the clock signal or continuously output the low level according to the signal at the output terminal of the first combinational logic circuit 2 of the previous stage and the output signal of the previous moment fed back by itself. In this way, the clock signal is divided to generate multiple sampling pulse signals.

Figure 7:
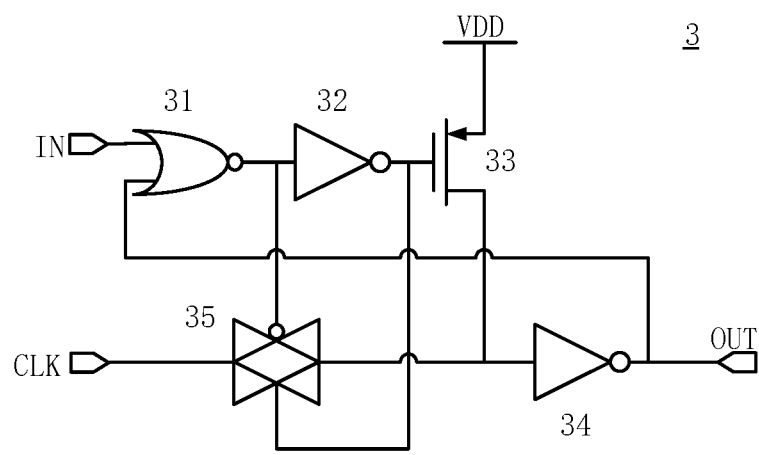
FIG. 7 is a schematic structural diagram of a second combinational logic circuit according to some embodiments of the present disclosure.
Figure 8:
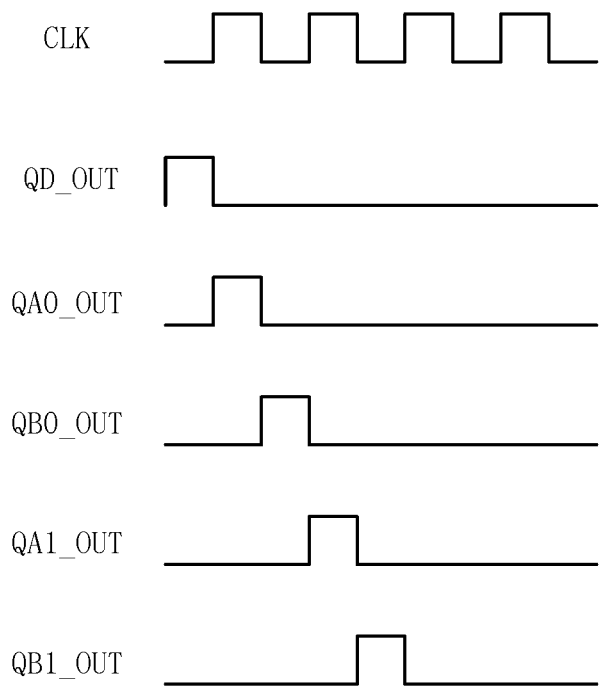
FIG. 8 is a timing diagram of counting of a counter according to some specific embodiments of the present disclosure.

According to some embodiments of the present disclosure, as shown in FIG. 7, the second combinational logic circuit 3 includes: a third NOR gate 31, a third NOT gate 32, a second transistor 33, a fourth NOT gate 34, and a second transmission gate 35.

The first input terminal of the third NOR gate 31 is coupled to the output terminal of the combinational logic circuit 2 of the previous stage, and the second input terminal of the third NOR gate 31 is coupled to the output terminal of the second combinational logic circuit 3. The input terminal of the third NOT gate 32 is coupled to the output terminal of the third NOR gate 31; the control electrode of the second transistor 33 is coupled to the output terminal of the third NOT gate 32, and the first electrode of the second transistor 33 is configured to input a direct current power signal; the input terminal of the fourth NOT gate 34 is coupled to the second electrode of the second transistor 33, and the output terminal of the fourth NOT gate 34 is coupled to the output terminal of the second combinational logic circuit 3. The input terminal of the second transmission gate 35 is configured to input the clock signal, the first control terminal of the second transmission gate 35 is coupled to the output terminal of the third NOR gate 31, the second control terminal of the second transmission gate 35 is coupled to the third NOT gate 32, and the output terminal of the second transmission gate 35 is coupled to the input terminal of the fourth NOT gate 34. The output terminal of the second transmission gate 35 is configured to output the clock signal when the second transmission gate 35 is turned on, and continuously output a high level signal when the second transmission gate 35 is turned off.

For example, in embodiments of the present disclosure, if the signal at the output terminal of the first combinational logic circuit 2 of the previous stage is a high level signal, that is, the signal at the first input terminal of the third NOR gate 31 being a high level signal, then the signal at the output terminal of the third NOR gate 31 is a low level signal, the signal at the output terminal of the third NOT gate 32 is a high level signal, the control electrode of the second transistor 33 is in a high level, the signal at the first input terminal of the second transmission gate 35 is a low level signal, and the signal at the second input terminal of the second transmission gate 35 is a high level signal. In this case, the second transmission gate 35 is turned on, the second transistor 33 is turned off, and the output terminal of the second transmission gate 35 outputs, via the output terminal of the fourth NOT gate 34, the inverted signal of the clock signal.

If the signal at the output terminal of the first combinational logic circuit 2 of the previous stage is a low level signal, and the signal fed back by the second combinational logic circuit 3 at the previous moment is a low level signal, that is, the signals at the first input terminal and the second input terminal of the third NOR gate 31 being low level signals, then the signal at the output terminal of the third NOR gate 31 is a high level signal, the signal at the output terminal of the third NOT gate 32 is a low level signal, the control electrode of the second transistor 33 is in a low level, and the signal at the first input terminal of the second transmission gate 35 is a high level signal. In this case, the second transmission gate 35 is turned off, the second transistor 33 is turned on, and the output terminal of the second transmission gate 35 continuously outputs, via the output terminal of the fourth NOT gate 34, a low level signal.

Specifically, according to some specific embodiments of the present disclosure, in conjunction with FIG. 4, FIG. 6, FIG. 7 and FIG. 8, the design principle of the counter according to the embodiments of the present disclosure is further described. The first combinational logic circuit 2 (for example, A0 and A1 in FIG. 4) may control the switch-on and switch-off of the first transmission gate 23 according to the start-up signal or the output signal of the second combinational logic circuit 3 of the previous stage, to output the clock signal or continuously output the low level signal. For example, when the first transmission gate 23 is turned on according to the start-up signal or the output signal of the second combinational logic circuit 3 of the previous stage, the first combinational logic circuit 2 outputs the clock signal; and when the first transmission gate 23 is turned off according to the start-up signal or the output signal of the second combinational logic circuit 3 of the previous stage, the first combinational logic circuit 2 continuously outputs the low level signal. In addition, the second combinational logic circuit 3 (for example, B0 and B1 in FIG. 4) may control the switch-on and switch-off of the second transmission gate 35 according to the output signal of the first combinational logic circuit 2 of the previous stage, to output the clock signal or continuously output the low level signal. For example, when the second transmission gate 35 is turned on according to the output signal of the first combinational logic circuit 2 of the previous stage, the second combinational logic circuit 3 outputs the clock signal, and when the second transmission gate 35 is turned off according to the output signal of the combinational logic circuit 2 of the previous stage, the second combinational logic circuit 3 continuously outputs the low level signal.

Figure 9:
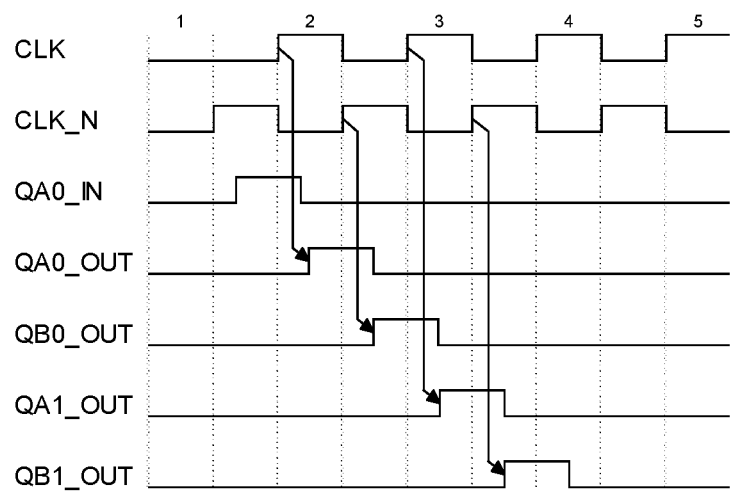
FIG. 9 is a timing diagram of counting of a counter according to some specific embodiments of the present disclosure.

It should be noted that, as shown in FIGS. 4, 6 and 9, when the first combinational logic circuit 2 controls, according to the output of the second combinational logic circuit 3 of the previous stage, the first transmission gate 23 to be turned on, there is a certain delay, the signal at the output terminal of the first combinational logic circuit 2 may follow the clock signal to become high, and further, the first transmission gate 23 is continuously turned on, so that the output signal continuously follows the clock signal until the clock signal changes to a low level signal. In this case, the first transmission gate 23 is turned off, and the output terminal of the first combinational logic circuit 2 is grounded and continuously output the low level signal.

In other words, the counter 100 according to the embodiments of the present disclosure may divide the high level signals of the clock signal via the first combinational logic circuit 2 and divide the low level signals of the clock signal via the second combinational logic circuit 3. In this way, based on the first combinational logic circuits 2 and the second combinational logic circuits 3 that are alternately cascaded, the pulse sampling signal corresponding to the high level of the clock signal and the pulse sampling signal corresponding to the low level of the clock signal in each clock cycle are obtained.

In summary, with the counter according to the embodiments of the present disclosure, the start-up signal is generated and outputted by the start-up circuit according to the inputted clock signal, then, the clock signal is outputted or the low level signal is continuously outputted by the first combinational logic circuit, and the inverted signal of the clock signal is outputted or the low level signal is continuously outputted by the second combinational logic circuit. As a result, the counter can divide the clock signal to generate multiple sampling pulse signals, and can reduce circuit power consumption and layout area.

Figure 10:
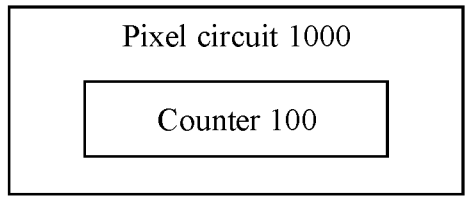
FIG. 10 is a block diagram of a pixel circuit according to some embodiments of the present disclosure.

FIG. 10 is a block diagram of a pixel circuit according to embodiments of the present disclosure.

As shown in FIG. 10, in embodiments of the present disclosure, the pixel circuit 1000 includes the counter 100.

In the pixel circuit according to the embodiments of the present disclosure, the counter is adopted, so that multiple sampling pulse signals can be generated by dividing the clock signal, and the power consumption of the circuit and the layout area are reduced.

Figure 11:
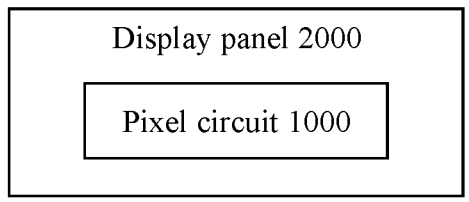
FIG. 11 is a block diagram of a display panel according to some embodiments of the present disclosure.

FIG. 11 is a block diagram of a display panel according to embodiments of the present disclosure.

As shown in FIG. 11, in embodiments of the present disclosure, the display panel 2000 may include the pixel circuit 1000.

In display panel according to the embodiments of the present disclosure, the pixel circuit is adopted, so that the clock signal can be divided to generate multiple sampling pulse signals, and the power consumption of the circuit and the layout area are reduced.

Figure 12:
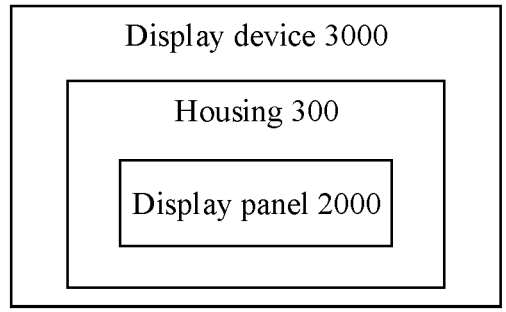
FIG. 12 is a block diagram of a display device according to some embodiments of the present disclosure.

FIG. 12 is a block diagram of a display device according to embodiments of the present disclosure.

As shown in FIG. 12, in embodiments of the present disclosure, the display device 3000 may include a housing 300 and the display panel 2000.

In the display device according to the embodiments of the present disclosure, the display panel is adopted, hence, the clock signal can be divided to generate multiple sampling pulse signals, and circuit power consumption and layout area can be reduced.

In some embodiments of the present disclosure, the display device may be, for example, any product or component with a display function, such as a mobile phone, a tablet computer, a television, a notebook computer, a digital photo frame, or a navigator.

In addition, the terms of "first" and "second" are merely used for descriptive purposes, and cannot be understood as indicating or implying relative importance or implicitly indicating the number of indicated technical features. Therefore, a feature defined with "first" or "second" may explicitly or implicitly includes at least one of the features. In the descriptions of the present disclosure, the term of "multiple" means at least two, such as two, three, etc., unless otherwise specifically defined.

In the present disclosure, unless otherwise expressly stipulated and defined, the terms of "installed", "connecting", "connected", "coupled", "fixed" and other terms should be understood in a broad sense. For example, they may represent fixed connection or may represent detachable connection or may represent integrated formation; they may represent mechanical connection or electrical connection; they may represent direct connection or indirect connection through an intermediary; and they may represent internal communication of two components or interaction between two components, unless otherwise specifically defined. For those of ordinary skill in the art, the specific meaning of the above-mentioned terms in the present disclosure may be understood according to specific circumstances.

In the descriptions of this specification, descriptions with reference to the terms of "an embodiment", "some embodiments", "examples", "specific examples", or "some examples" etc., mean that specific features, structures, materials, or characteristics described in conjunction with the embodiments or examples are included in at least one embodiment or example of the present disclosure. In this specification, the illustrative representations of the above terms do not necessarily refer to the same embodiments or examples. Moreover, the specific features, structures, materials, or characteristics as described may be combined in any one or more embodiments or examples in an appropriate manner. In addition, without contradicting each other, those skilled in the art may join and combine different embodiments or examples and features of the different embodiments or examples described in this specification.

Although the embodiments of the present disclosure are illustrated and described in the above, it can be understood that the above embodiments are exemplary and should not be construed as limiting the present disclosure. Changes, modifications, substitutions and variations of the above embodiments can be made by those of ordinary shill in the art within the scope of the present disclosure.

What is claimed is:

1. A counter, comprising:
    a start-up circuit, configured to generate a start-up signal according to an inputted clock signal and output the start-up signal; and
    M first combinational logic circuits and M second combinational logic circuits, wherein the M first combinational logic circuits and the M second combinational logic circuits are alternate and cascaded, and M is an integer greater than or equal to 1;
    wherein an input terminal of the first combinational logic circuit is coupled to an output terminal of the start-up circuit or an output terminal of the second combinational logic circuit of a previous stage, an input terminal of the second combinational logic circuit is coupled to an output terminal of the first combinational logic circuit of a previous stage, and each of a clock signal terminal of the first combinational logic circuit and a clock signal terminal of the second combinational logic circuit is configured to input the clock signal; and
    wherein the first combinational logic circuit is configured to output the clock signal in a first time period and continuously output a low level signal in a second time period, and the second combinational logic circuit is configured to output an inverted signal of the clock signal in a third time period and continuously output a low level signal in a fourth time period;
    wherein the start-up circuit is configured to:
    generate the start-up signal of a current moment according to the clock signal and a start-up signal of a previous moment, wherein the start-up signal of the previous moment is fed back by the start-up circuit;
    wherein the start-up circuit comprises:
    a first NOR gate, wherein a first input terminal of the first NOR gate is configured to input the clock signal, and an output terminal of the first NOR gate is configured to output the start-up signal; and
    a first NOT gate, wherein an input terminal of the first NOT gate is coupled to the output terminal of the first NOR gate, and an output terminal of the first NOT gate is coupled to a second input terminal of the first NOR gate.

2. The counter according to claim 1, wherein the first combinational logic circuit is configured to:
    output the clock signal in the first time period and continuously output the low level signal in the second time period, according to the start-up signal or a signal of the output terminal of the second combinational logic circuit of the previous stage and according to a signal fed back by the first combinational logic circuit at a previous moment.

3. The counter according to claim 2, wherein the first combinational logic circuit comprises:
    a second NOR gate, wherein a first input terminal of the second NOR gate is coupled to the output terminal of the start-up circuit or the output terminal of the combinational logic circuit of the previous stage;
    a first transistor, wherein a control electrode of the first transistor is coupled to an output terminal of the second NOR gate, a first electrode of the first transistor is coupled to a second input terminal of the second NOR gate, and a second electrode of the first transistor is grounded;
    a first transmission gate, wherein an input terminal of the first transmission gate is configured to input the clock signal, a first control terminal of the transmission gate is coupled to the output terminal of the second NOR gate, an output terminal of the first transmission gate is coupled to the output terminal of the first combinational logic circuit, and the output terminal of the first transmission gate is configured to output the clock signal when the first transmission gate is turned on and continuously output a low level signal when the first transmission gate is turned off; and
    a second NOT gate, wherein an input terminal of the second NOT gate is coupled to the output terminal of the second NOR gate, and an output terminal of the second NOT gate is coupled to a second control terminal of the first transmission gate.

4. The counter according to claim 1, wherein the second combinational logic circuit is configured to:
    output the inverted signal of the clock signal in the third time period and continuously output the low level signal in the fourth time period, according to a signal of the output terminal of the first combinational logic circuit of the previous stage and a signal fed back by the second combinational logic circuit at a previous moment.

5. The counter according to claim 4, wherein the second combinational logic circuit comprises:
    a third NOR gate, wherein a first input terminal of the third NOR gate is coupled to the output terminal of the combinational logic circuit of the previous stage, and a second input terminal of the third NOR gate is coupled to the output terminal of the second combinational logic circuit;
    a third NOT gate, wherein an input terminal of the third NOT gate is coupled to an output terminal of the third NOR gate;
    a second transistor, wherein a control electrode of the second transistor is coupled to the output terminal of the third NOT gate, and a first electrode of the second transistor is configured to input a direct current power signal;
    a fourth NOT gate, wherein an input terminal of the fourth NOT gate is coupled to a second electrode of the second transistor, and an output terminal of the fourth NOT gate is coupled to the output terminal of the second combinational logic circuit; and
    a second transmission gate, wherein an input terminal of the second transmission gate is configured to input the clock signal, a first control terminal of the second transmission gate is coupled to the output terminal of the third NOR gate, a second control terminal of the second transmission gate is coupled to an output terminal of the third NOT gate, an output terminal of the second transmission gate is coupled to the input terminal of the fourth NOT gate, and the output terminal of the second transmission gate is configured to output the clock signal when the second transmission gate is turned on and continuously output a high level signal when the second transmission gate is turned off.

6. The counter according to claim 3, wherein the second combinational logic circuit is configured to:

output the inverted signal of the clock signal in the third time period and continuously output the low level signal in the fourth time period, according to a signal of the output terminal of the first combinational logic circuit of the previous stage and a signal fed back by the second combinational logic circuit at a previous moment.

7. The counter according to claim 6, wherein the second combinational logic circuit comprises:
a third NOR gate, wherein a first input terminal of the third NOR gate is coupled to the output terminal of the combinational logic circuit of the previous stage, and a second input terminal of the third NOR gate is coupled to the output terminal of the second combinational logic circuit;
a third NOT gate, wherein an input terminal of the third NOT gate is coupled to an output terminal of the third NOR gate;
a second transistor, wherein a control electrode of the second transistor is coupled to the output terminal of the third NOT gate, and a first electrode of the second transistor is configured to input a direct current power signal;
a fourth NOT gate, wherein an input terminal of the fourth NOT gate is coupled to a second electrode of the second transistor, and an output terminal of the fourth NOT gate is coupled to the output terminal of the second combinational logic circuit; and
a second transmission gate, wherein an input terminal of the second transmission gate is configured to input the clock signal, a first control terminal of the second transmission gate is coupled to the output terminal of the third NOR gate, a second control terminal of the second transmission gate is coupled to an output terminal of the third NOT gate, an output terminal of the second transmission gate is coupled to the input terminal of the fourth NOT gate, and the output terminal of the second transmission gate is configured to output the clock signal when the second transmission gate is turned on and continuously output a high level signal when the second transmission gate is turned off.

8. A pixel circuit, comprising the counter according to claim 1.

9. A display panel, comprising the pixel circuit according to claim 8.

10. A display device, comprising a housing and the display panel according to claim 9.

11. A counter, comprising:
a start-up circuit, configured to generate a start-up signal according to an inputted clock signal and output the start-up signal; and
M first combinational logic circuits and M second combinational logic circuits, wherein the M first combinational logic circuits and the M second combinational logic circuits are alternate and cascaded, and M is an integer greater than or equal to 1;
wherein an input terminal of the first combinational logic circuit is coupled to an output terminal of the start-up circuit or an output terminal of the second combinational logic circuit of a previous stage, an input terminal of the second combinational logic circuit is coupled to an output terminal of the first combinational logic circuit of a previous stage, and each of a clock signal terminal of the first combinational logic circuit and a clock signal terminal of the second combinational logic circuit is configured to input the clock signal; and
wherein the first combinational logic circuit is configured to output the clock signal in a first time period and continuously output a low level signal in a second time period, and the second combinational logic circuit is configured to output an inverted signal of the clock signal in a third time period and continuously output a low level signal in a fourth time period;
wherein the first combinational logic circuit is configured to:
output the clock signal in the first time period and continuously output the low level signal in the second time period, according to the start-up signal or a signal of the output terminal of the second combinational logic circuit of the previous stage and according to a signal fed back by the first combinational logic circuit at a previous moment;
wherein the first combinational logic circuit comprises:
a second NOR gate, wherein a first input terminal of the second NOR gate is coupled to the output terminal of the start-up circuit or the output terminal of the combinational logic circuit of the previous stage;
a first transistor, wherein a control electrode of the first transistor is coupled to an output terminal of the second NOR gate, a first electrode of the first transistor is coupled to a second input terminal of the second NOR gate, and a second electrode of the first transistor is grounded;
a first transmission gate, wherein an input terminal of the first transmission gate is configured to input the clock signal, a first control terminal of the transmission gate is coupled to the output terminal of the second NOR gate, an output terminal of the first transmission gate is coupled to the output terminal of the first combinational logic circuit, and the output terminal of the first transmission gate is configured to output the clock signal when the first transmission gate is turned on and continuously output a low level signal when the first transmission gate is turned off; and
a second NOT gate, wherein an input terminal of the second NOT gate is coupled to the output terminal of the second NOR gate, and an output terminal of the second NOT gate is coupled to a second control terminal of the first transmission gate.

12. The counter according to claim 11, wherein the start-up circuit is configured to:
generate the start-up signal of a current moment according to the clock signal and a start-up signal of a previous moment, wherein the start-up signal of the previous moment is fed back by the start-up circuit.

13. The counter according to claim 11, wherein the second combinational logic circuit is configured to:
output the inverted signal of the clock signal in the third time period and continuously output the low level signal in the fourth time period, according to a signal of the output terminal of the first combinational logic circuit of the previous stage and a signal fed back by the second combinational logic circuit at a previous moment.

14. The counter according to claim 13, wherein the second combinational logic circuit comprises:
a third NOR gate, wherein a first input terminal of the third NOR gate is coupled to the output terminal of the combinational logic circuit of the previous stage, and a second input terminal of the third NOR gate is coupled to the output terminal of the second combinational logic circuit;

a third NOT gate, wherein an input terminal of the third NOT gate is coupled to an output terminal of the third NOR gate;

a second transistor, wherein a control electrode of the second transistor is coupled to the output terminal of the third NOT gate, and a first electrode of the second transistor is configured to input a direct current power signal;

a fourth NOT gate, wherein an input terminal of the fourth NOT gate is coupled to a second electrode of the second transistor, and an output terminal of the fourth NOT gate is coupled to the output terminal of the second combinational logic circuit; and a second transmission gate, wherein an input terminal of the second transmission gate is configured to input the clock signal, a first control terminal of the second transmission gate is coupled to the output terminal of the third NOR gate, a second control terminal of the second transmission gate is coupled to an output terminal of the third NOT gate, an output terminal of the second transmission gate is coupled to the input terminal of the fourth NOT gate, and the output terminal of the second transmission gate is configured to output the clock signal when the second transmission gate is turned on and continuously output a high level signal when the second transmission gate is turned off.

15. A pixel circuit, comprising the counter according to claim 11.

16. A display panel, comprising the pixel circuit according to claim 15.

17. A counter, comprising:

a start-up circuit, configured to generate a start-up signal according to an inputted clock signal and output the start-up signal; and M first combinational logic circuits and M second combinational logic circuits, wherein the M first combinational logic circuits and the M second combinational logic circuits are alternate and cascaded, and M is an integer greater than or equal to 1;

wherein an input terminal of the first combinational logic circuit is coupled to an output terminal of the start-up circuit or an output terminal of the second combinational logic circuit of a previous stage, an input terminal of the second combinational logic circuit is coupled to an output terminal of the first combinational logic circuit of a previous stage, and each of a clock signal terminal of the first combinational logic circuit and a clock signal terminal of the second combinational logic circuit is configured to input the clock signal; and wherein the first combinational logic circuit is configured to output the clock signal in a first time period and continuously output a low level signal in a second time period, and the second combinational logic circuit is configured to output an inverted signal of the clock signal in a third time period and continuously output a low level signal in a fourth time period;

wherein the second combinational logic circuit is configured to:

output the inverted signal of the clock signal in the third time period and continuously output the low level signal in the fourth time period, according to a signal of the output terminal of the first combinational logic circuit of the previous stage and a signal fed back by the second combinational logic circuit at a previous moment;

wherein the second combinational logic circuit comprises:

a third NOR gate, wherein a first input terminal of the third NOR gate is coupled to the output terminal of the combinational logic circuit of the previous stage, and a second input terminal of the third NOR gate is coupled to the output terminal of the second combinational logic circuit;

a third NOT gate, wherein an input terminal of the third NOT gate is coupled to an output terminal of the third NOR gate;

a second transistor, wherein a control electrode of the second transistor is coupled to the output terminal of the third NOT gate, and a first electrode of the second transistor is configured to input a direct current power signal;

a fourth NOT gate, wherein an input terminal of the fourth NOT gate is coupled to a second electrode of the second transistor, and an output terminal of the fourth NOT gate is coupled to the output terminal of the second combinational logic circuit; and a second transmission gate, wherein an input terminal of the second transmission gate is configured to input the clock signal, a first control terminal of the second transmission gate is coupled to the output terminal of the third NOR gate, a second control terminal of the second transmission gate is coupled to an output terminal of the third NOT gate, an output terminal of the second transmission gate is coupled to the input terminal of the fourth NOT gate, and the output terminal of the second transmission gate is configured to output the clock signal when the second transmission gate is turned on and continuously output a high level signal when the second transmission gate is turned off.

18. The counter according to claim 17, wherein the start-up circuit is configured to:

generate the start-up signal of a current moment according to the clock signal and a start-up signal of a previous moment, wherein the start-up signal of the previous moment is fed back by the start-up circuit.

19. The counter according to claim 17, wherein the first combinational logic circuit is configured to:

output the clock signal in the first time period and continuously output the low level signal in the second time period, according to the start-up signal or a signal of the output terminal of the second combinational logic circuit of the previous stage and according to a signal fed back by the first combinational logic circuit at a previous moment.

20. A pixel circuit, comprising the counter according to claim 17.

* * * * *